United States Patent
Casey et al.

(10) Patent No.: US 6,448,589 B1
(45) Date of Patent: Sep. 10, 2002

(54) SINGLE SIDE CONTACTS FOR A SEMICONDUCTOR DEVICE

(75) Inventors: Kelly C. Casey, Flower Mound; Elmer Lee Turner, Jr., Irving, both of TX (US)

(73) Assignee: Teccor Electronics, L.P., Irving, TX (US)

( * ) Notice: Subject to any disclaimer, the term of this patent is extended or adjusted under 35 U.S.C. 154(b) by 0 days.

(21) Appl. No.: 09/575,861

(22) Filed: May 19, 2000

(51) Int. Cl.⁷ .............................................. H01L 29/74
(52) U.S. Cl. ...................................... 257/173; 438/546
(58) Field of Search .............................. 257/173, 181, 257/276, 355, 621; 438/546, 570

(56) References Cited

U.S. PATENT DOCUMENTS

| | | | |
|---|---|---|---|
| 3,968,511 A | * 7/1976 | Yagi et al. | 357/36 |
| 3,978,514 A | * 8/1976 | Ogawa et al. | 357/39 |
| 3,982,268 A | 9/1976 | Anthony et al. | 357/55 |
| 4,275,410 A | 6/1981 | Grinberg et al. | 357/68 |
| 4,570,173 A | * 2/1986 | Anthony et al. | 357/20 |
| 4,589,190 A | * 5/1986 | Anthony | 29/571 |
| 4,660,063 A | * 4/1987 | Anthony | 357/25 |
| 5,424,245 A | 6/1995 | Gurtler et al. | 437/183 |
| 5,479,031 A | 12/1995 | Webb et al. | 257/173 |
| 5,682,062 A | 10/1997 | Gaul | 257/686 |
| 5,742,098 A | 4/1998 | Brunner | 257/730 |
| 5,828,089 A | 10/1998 | Bernier | 257/173 |

* cited by examiner

*Primary Examiner*—Hoai Ho
*Assistant Examiner*—Quoc Hoang
(74) *Attorney, Agent, or Firm*—Roger N. Chauza, Esq.; Chauza & Handley, L.L.P.

(57) ABSTRACT

A connector block formed in a semiconductor chip to provide all contacts on the same side of the chip. The connector block is preferably formed by driving a slow diffusing dopant deep into the chip from both sides until the diffused dopant overlaps in the middle of the chip. The connector block is metalized with a top contact and connected to circuits. The bottom of the connector block is metallized and connected to other bottom side contacts which, in turn may be connected to circuits. This arrangement effectively allows all contacts to be available from the top side of the semiconductor chip.

17 Claims, 2 Drawing Sheets

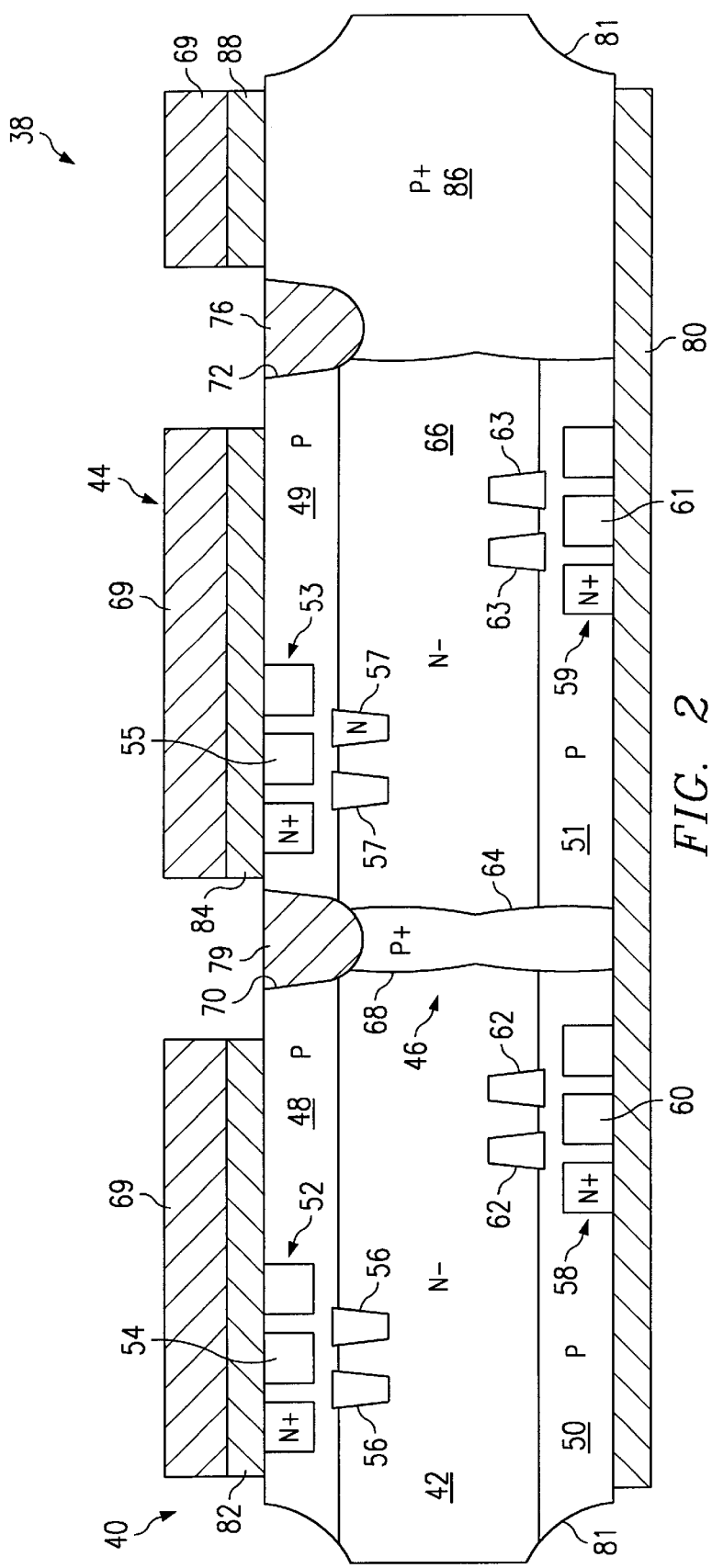
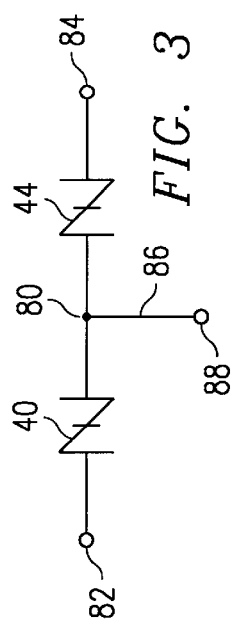
FIG. 2
FIG. 3

SINGLE SIDE CONTACTS FOR A SEMICONDUCTOR DEVICE

TECHNICAL FIELD OF THE INVENTION

The present invention relates in general to semiconductor chips, and more particularly to the formation of electrical contacts on the chips.

BACKGROUND OF THE INVENTION

The fabrication techniques in forming various digital and analog circuits in semiconductor substrates are well known and documented in the prior art. Irrespective of the type of circuit formed in the semiconductor material, electrical contacts are necessary for accessing the input and output regions of the semiconductor circuits. Much like the fabrication of the circuits in the semiconductor material, the formation of contacts using various metals is also well known. While not an elementary task, the mating of various metals to the silicon or other semiconductor material requires a number of fabrication steps so that the metals can be reliably alloyed to the semiconductor material to provide a low resistance contact.

Many semiconductor devices may be formed in one face or surface of a semiconductor chip. The remainder of the bulk semiconductor material, i.e., the substrate, does not carry signal currents. In this instance, most of the metal contacts are typically formed on the same side, in contact with the various semiconductor regions. In certain cases, the backside of the chip is also metalized to provide a voltage potential thereto for biasing the substrate at a potential with regard to the other voltages applied to the top-side contacts. The backside contact does not otherwise affect the operation of the circuit, nor do signal currents pass through such contact. When fastening the semiconductor chips to metal lead frames, or the like, it can be appreciated that contact need be made only to the top side of the chip, thus construction of the various lead frames is simplified. In other words, if lead frame connections from both top side contacts and bottom side contacts are not required, assembly, packaging and testing of the devices is facilitated.

Other types of semiconductor devices have circuits formed in both face surfaces thereof. In this instance, contacts that carry signal currents are required on both sides. As noted above, this requirement complicates the assembly and testing of the devices. Attempts have been made to provide metal contacts on the same side of the semiconductor chip by way of conductive vias formed through the semiconductor chip from one face to the opposite face thereof. U.S. Pat. No. 3,982,268 by Anthony, et al., discloses a technique for forming active circuits on both sides of a semiconductor chip. These circuits are electrically connected together through the chip by utilizing a via of highly conductive material formed by the thermomigration of a droplet of metal. Electrical contacts are formed on the top and bottom surfaces of the low-resistance via to thereby form a conductive path through the wafer. The circuits on one side are thus connected by way of the via to the circuits on the other side of the chip.

The thermomigration of metal to form the low-resistance region can be accomplished in a relatively short period of time, in that metal diffuses very quickly in semiconductor material in response to a high temperature thermal drive. In U.S. Pat. No. 4,275,410 by Grinberg, et al., microinterconnects are formed through the semiconductor chip. Aluminum is deposited by a metal evaporator to form aluminum dots on the surface of the chip. The thermomigration process is then carried out to cause the aluminum to diffuse through the chip, from one side to the other. U.S. Pat. No. 5,682,062 by Gaul discloses a method of forming interconnects for stacked integrated circuits. According to this technique, trenches are formed in the semiconductor material, and an insulating silicon oxide is formed on the side wall. Then, a conductive material, such as an N-type doped polysilicon, is deposited so as to fill the trench and form a conductive via from one semiconductor chip surface to the other. While this technique may be effective, numerous processing steps and masks are involved in forming trenches, the deposition of the isolation oxide and refilling the trenches, which all add to the cost of the device.

SUMMARY OF THE INVENTION

In accordance with the principles and concepts of the invention, there is disclosed a method for efficiently forming a connector block through a semiconductor chip.

In accordance with one aspect of the invention, active semiconductor regions are formed in the chip to provide a desired electrical function. Formed from one face of the chip to the other is a conductive connector block for carrying current from one face of the semiconductor chip to the other. When the connector block is metalized to form surface contacts, all contacts to the semiconductor device can be formed on one face of the chip.

In another form of the invention, circuits are formed in both faces of the chip. An overvoltage surge device is fabricated so that all terminals thereof are on the same surface of the chip. This facilitates the utilization of a planar lead frame which need only be soldered or bonded to one surface of the chip.

In one application, two overvoltage surge devices employing buried regions are formed in the semiconductor chip, with a highly conductive semiconductor region therebetween functioning as electrical isolation between the devices. At the same time and through the same process step in forming the buried and isolation regions, the connector block is also formed from one face of the semiconductor chip to the other. After metalization, all contacts can be located on the same face of the chip. As many connector blocks can be formed as needed.

In yet another embodiment, the semiconductor chip is formed with at least one active circuit therein. A first contact is formed on one face surface of the chip, in contact with the circuit. A second contact is formed on the same face surface of the chip. A third contact is formed on an opposing side of the semiconductor chip in contact with a circuit. A conductive connector block is formed with nonmetal impurities from one face to the other face surface of the chip, and formed in contact with the second and third contacts. All contacts carrying circuit currents are thus located on one side of the semiconductor chip.

The present invention can provide a conductive path which can be formed through the semiconductor chip from one face surface to the other utilizing standard deposition and semiconductor diffusion techniques with dopants characterized by low diffusion constants. Further, the invention also provides a technique in forming conductive paths through a semiconductor chip by diffusing the impurities therein, together with other impurities to form different semiconductor regions for the active circuits. An advantage of the invention is that conductive paths can by formed by a long term thermal drive of low diffusion constant dopants, at the same time as doped isolation regions are formed. Another advantage of the invention is that it provides a more economical packaging of semiconductor chips by using a single planar lead frame without bending or otherwise soldering plural lead frames together.

BRIEF DESCRIPTION OF THE DRAWINGS

For a more complete understanding of the present invention and the advantages thereof, reference is now made to the following description taken in conjunction with the accompanying Drawings where like reference characters identify similar elements, and in which:

FIG. 2 illustrates a cross-sectional view of the semiconductor device constructed according to one embodiment of the invention;

FIG. 3 illustrates an electrical diagram of the device of FIG. 2; and

DETAILED DESCRIPTION OF THE INVENTION

Figure 1:
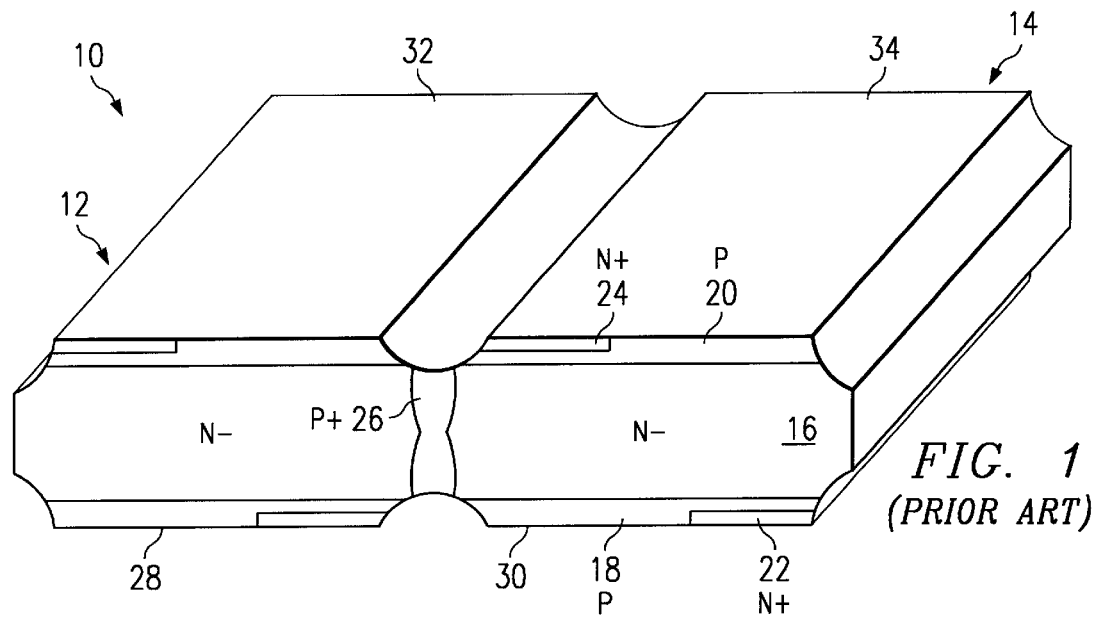
FIG. 1 illustrates a pair of semiconductor devices constructed according to the prior art, where an isolation region is formed through the semiconductor chip to electrically isolate the operation of the devices.

FIG. 1 illustrates a pair of overvoltage surge protection devices 12, 14 constructed according to the prior art. Such devices are available under the trademark SIDACtor® from Teccor Electronics, Inc., Irving, Tex. A first device 12 and a second device 14 are formed in the same semiconductor chip 10. Each device 12 and 14 carries current therethrough in a bidirectional manner. Device 14 includes a lightly doped N-type mid-region 16 with P-type base regions 18 and 20 formed in both faces thereof. Not shown are plural buried regions which facilitate conduction at a specified breakover voltage. Formed in each base region 18 and 20 is a respective emitter region 22 and 24. The emitter regions 22 and 24 are heavily doped N-type regions. Not shown are shorting dots formed in the emitter regions 22 and 24. The companion overvoltage surge protection device 12 is fabricated in a substantially identical manner. Each device 12 and 14 can be fabricated in the manner described in U.S. Pat. No. 5,479,031 by Webb, et al.

When fabricating a pair of devices 12 and 14 in the same chip 10, the devices 12 and 14 are electrically isolated by the formation of a heavily doped P-type semiconductor region 26. The isolation region 26 extends along the entire interface between the devices 12 and 14 to provide electrical isolation so that independent electrical operation is achieved. Lightly doped N-type mid-region 16 together with the heavily doped P-type isolation region 26 form a PN junction. The PN junctions between each device 12 and 14 form a respective high voltage breakdown isolation diode.

FIG. 1 does not show the metalization to form the contacts. However, the dual device chip lo is otherwise metalized by depositing a single metal contact on the bottom of the chip, thereby short circuiting surfaces 28 and 30. The top surface 32 of device 12 is individually metalized, as is the top surface 34 of device 14. It can be appreciated that when the chip 10 of FIG. 1 is to be attached to a metal lead frame, not only are the lead frames more complicated, as both surface contacts are soldered to respective lead frames, but various additional bending and lead frame soldering operations are required.

While heavily doped isolation diffusions, such as diffusion 26 shown in FIG. 1, are well known in the art for isolating electrical circuits formed in semiconductor chips, a new technique is described below for utilizing similar regions for connector blocks to provide a conductive path from one face of the chip to the other. When metalized, all contacts can thus be made available on one face of the chip. Assembly and test of the chip is simplified, thereby reducing the cost of the chip.

FIG. 2 is a cross-sectional view of a pair of overvoltage surge protection devices 40, 44 formed in a semiconductor chip 38 in such a manner such that all electrical contacts appear on one surface of the chip 38. A first overvoltage surge protection device 40 and a second overvoltage surge protection device 44 are formed in a silicon chip that is lightly doped with an N-type impurity. The devices 40 and 44 may be identical in operation, or they may be formed according to different processes to achieve different operating characteristics. The electrical operation of the devices 40 and 44 are independent because of an electrical isolation therebetween. As will be described in more detail below, the electrical isolation constitutes the traditional isolation diffusion 46 of a P-type material in the N-type mid-region. This forms two PN junctions in the respective mid-regions 42 and 66 of the devices 40 and 44.

Portions of each device, such as device 40 to be described below, can be constructed in a manner similar to that set forth in U.S. Pat. No. 5,479,031 by Webb et al, the disclosure of which is incorporated herein by reference. The overvoltage surge protection devices 40, 44 are two-terminal devices typically used to protect circuits from overvoltage transients. To that end, a number of heavily doped N-type buried regions, one identified as reference numeral 56, are formed deep into the chip 38 in the mid-region 42 of device 40. The buried regions 56 provide better control over the breakover voltage by which the device 40 is triggered into conduction. Once triggered into a conduction state, a low on-state voltage (much like an SCR) is developed across the device 40. An upper P-type base region 48 and a lower P-type region 50 are formed in the N-type mid-region 42. Formed in the top base region 48 over the buried regions 56 is an emitter 52 having formed therein plural shorting dots 54. The shorting dots 54 are essentially the absence of the emitter material so that the base material 48 extends through openings in the emitter 52 to the surface of the chip 38. Formed at the bottom of the chip 38 in base region 50 of device 40 is a corresponding emitter 58, shorting dots 60 and buried regions 62. By fabricating the device 40 in the described manner, the device 40 can be triggered into conduction when a voltage of either polarity across the device 40 exceeds the breakover voltage. Conduction of current in either direction can thus occur to clamp the circuit voltage to the low on-state voltage of the device 40.

The second device 44 can be formed in an identical manner as described above in connection with device 40. As an alternative, the device 44 can be formed using different processing steps. For example, device 40 can be made to operate at a first breakover voltage, and device 44 can be made to operate at a different breakover voltage. Other electrical operating differences can be achieved as between the devices 40 and 44, such as holding currents, etc., by varying the process steps.

The second device 44 includes a top base region 49 and a bottom base region 51 formed in the N-type mid-region 66. Also formed in the mid-region 66 are upper buried regions 57 and lower buried regions 63. A top emitter 53 with shorting dots 55 is formed in the top base region 49. In like manner, an emitter 59 with shorting dots 61 is formed in the bottom base region 51. A metal contact 84 is formed on the top face surface of the device 44. The common lower contact 80 that is connected to the bottom face surface of device 40 is also connected to the bottom face surface of the device 44. A trench 72 filled with an insulator 76 separates the upper base region 49 of device 44 from the connector block 86.

As noted above, a heavily doped isolation region 46 is formed to electrically isolate the device 40 from the device 44. In practice, boron or other P-type impurities are deposited on both sides of the chip 38 which has been masked to provide openings where the isolation region 46 is to be formed. The semiconductor chip is also masked to form openings on both sides of the chip to define where the connector block 86 is to be formed. The formation of the isolation region 46 and the connector block 86 is carried out together.

The chip 38 is heavily doped according to conventional techniques with P-type boron or other impurities to achieve the P+ concentration in the isolation region 46 and the connector block 8. Then, the chip 38 is subjected to an initial thermal drive for a predefined number of hours such that the boron diffuses from both sides into the chip 38 for a specified distance. The initial thermal drive of 1275° C. is carried out for about one day to drive the heavily doped P+ impurities of the connector block 86 into the top and bottom surfaces of the semiconductor chip to a depth of about 1.5–2.0 mils. The purpose of the initial thermal drive is to reduce the surface concentration of the boron impurity so that subsequent oxidation of the chip surface forms a mask of suitable quality.

After the initial thermal drive, the semiconductor chip is again processed to form another mask for defining the locations of the N-type buried regions. A silicon oxide is formed over the isolation surface areas and the connector block surface areas so that the N-type dopants do not neutralize the P-type impurities of the isolation region 46 and the connector block 86. Once the N-type impurities have been deposited in the masked openings, the chip 38 is subjected to a long term and final thermal drive. The second thermal drive is carried out for a time ranging between about 5–10 days. The thermal drive time is also a function of the thickness of the semiconductor chip 38 which, in the described embodiment is about 10 mils thick. This long period of time is necessary to allow the N-type impurities to diffuse deeply into the semiconductor material of the chip 38. It should be appreciated that during the second thermal drive, the impurities of the isolation region 46 and the connector block 86 continue to diffuse into the semiconductor material. The long thermal drive assures that the P+ impurities of the isolation region 46 and the connector block 86 overlap in the middle of the chip 38. The N-type impurities of the buried regions 56, 57, 62 and 63 do not merge together and overlap because the impurity concentration of the N-type dopants is much less than that of the P-type dopants. Even though 10 hours may be more than necessary to form the overlapped isolation region 46 and the overlapped connector block 86, the only ramification is that such diffused regions 46 and 86 spread laterally. Thus, sufficient lateral room must be allowed for such diffused regions 46 and 86.

It can be appreciated that because of the necessity of the long term thermal drives, metal dopants such as aluminum would be highly unsatisfactory. Since the diffusion constant of aluminum is much higher than that of most standard semiconductor impurities, the aluminum material would diffuse so quickly that it would reach the junctions of the devices 40 and 44 and destroy such junctions.

When the isolation region 46 and the connector block 86 are formed with P-type impurities, boron or gallium can be used. In those designs where such diffused regions are formed with N-type impurities, phosphorus, arsenic and antimony may be used. The diffusion constant of all of these standard semiconductor impurities is much less than that of other metals, such as aluminum. Stated another way, when using these standard semiconductor impurities, they are well suited for the long thermal drives, whereas the aluminum metal would diffuse too quickly and damage the circuit junctions. It is believed that impurities having diffusion constants less than about $2\times10^{-11}$ $cm^2/sec$ at a driving temperature of about 1275° C. are well suited for use with the invention.

When the formation of the isolation region 46 the connector block 86 are completed, a first PN junction 64 is formed with respect to the isolation region 46 and the N-type mid- region of device 44. The second PN junction 68 is similarly formed with regard to the isolation region 46 and the mid-region 42 of the device 40. Because the mid-regions 42 and 66 are lightly doped, the breakdown voltage of such PN junctions is greater than the operating voltage of either device.

A grid trench 70 is formed in the chip 38 above the isolation region 46. The grid trench 70 is sufficiently deep to allow the various junctions that terminate in the trench to be sufficiently separated so that voltage punch-through does not occur. Punch-through can occur when the depletion region of one junction joins the depletion region of another junction. A similar trench 72 is formed in the top surface of the chip 38 at a location where a connector block 86 forms a reverse-biased junction with the mid-region 66. The trenches 70 and 72 are then filled with an insulating material 74 and 76 to provide passivation and electrical isolation to the junctions.

As noted from the cross-sectional view of FIG. 2, the devices 40 and 44 are not merely surface devices, as is conventional with many transistor circuits. Rather, the devices 40 and 44 utilize the entire bulk silicon area of the chip 38 for signal currents to provide bidirectional operating characteristics. The entire bottom surface of the chip 38 is metalized with a contact 80, with the exception of a trench 81 that is formed around each chip 38 of the wafer. The trench 81 facilitates chip scribing and separation from the other chips of the wafer. The bottom contact 80 corresponds to a common contact for both devices 40 and 44. Device 40 includes a top contact 82, and device 44 includes a separate top contact 84. The metal contacts 80, 82 and 84 are formed by first alloying a thin layer of nickel into the silicon chip 38 by a standard silicide process. Then, another layer of nickel is deposited thereover to form the contacts 80, 82 and 84. Other contact materials and processes can be utilized.

In accordance with an important feature of the invention, the conductive connector block 86 is formed to provide a low resistance path between the bottom metal contact 80 and a top metal contact 88 formed on the face surface of the chip over the connector block 86. The P-type impurities used in forming the connector block 86 are deposited with a concentration to achieve a resultant resistivity in the range of about 1–5 ohm per square. It is desirable to provide an initial boron concentration such that when driven deep into the chip 38 so as to overlap in the middle, the ohmic resistance of the connector block 86 from contact 88 to contact 80 is in the range of about 0.01–0.10 ohm. Those skilled in the art can determine the impurity concentration and the dopant needed to achieve this resistivity. The desired bulk resistivity of the connector block 86 is a function of the current carried through the device, and thus for smaller currents, larger connector block resistances may be acceptable. The boron impurity deposited on the top and bottom surfaces of the chip 38 may be at the maximum concentration limited to the solubility of boron in silicon.

The low resistance connector block 86 forms a conductive path so that all circuit currents carried from the top contacts 82 and 84 to the bottom contact 80, can then be carried upwardly through the connector block 86 to the top-surface contact 88. The same is true for circuit currents carried in the opposite direction. Accordingly, all contacts required by the devices are located on the top surface of the chip 38. This makes the soldering of a single lead frame 69 to the top side contacts 82, 84 and 88 an easier task with less complex assembly fixtures.

While FIG. 2 illustrates a semiconductor chip 38 having two devices formed therein. In the event that only a single device is desired, then the device 40 shown on the left can be omitted, together with the isolation region 46. The remaining device 44 has both contacts 84 and 88 available from the top side of the chip 38.

FIG. 3 is an electrical diagram of the circuit configuration formed in the semiconductor chip 38 of FIG. 2. Each device 40 and 44, which is an overvoltage surge protection device, has a separate respective contact 82 and 84. These are the individual top contacts formed on the top face surface of the semiconductor chip 38. Each device 40 and 44 is connected together by a common contact 80 formed on the bottom face surface of the semiconductor chip 38. The common contact 80 is coupled through the connector block 86 to the top side contact 88. All contacts are thus available from one side of the semiconductor chip 38. A planar lead frame can be easily utilized to solder the chip 38 thereto during final assembly.

Figure 4:
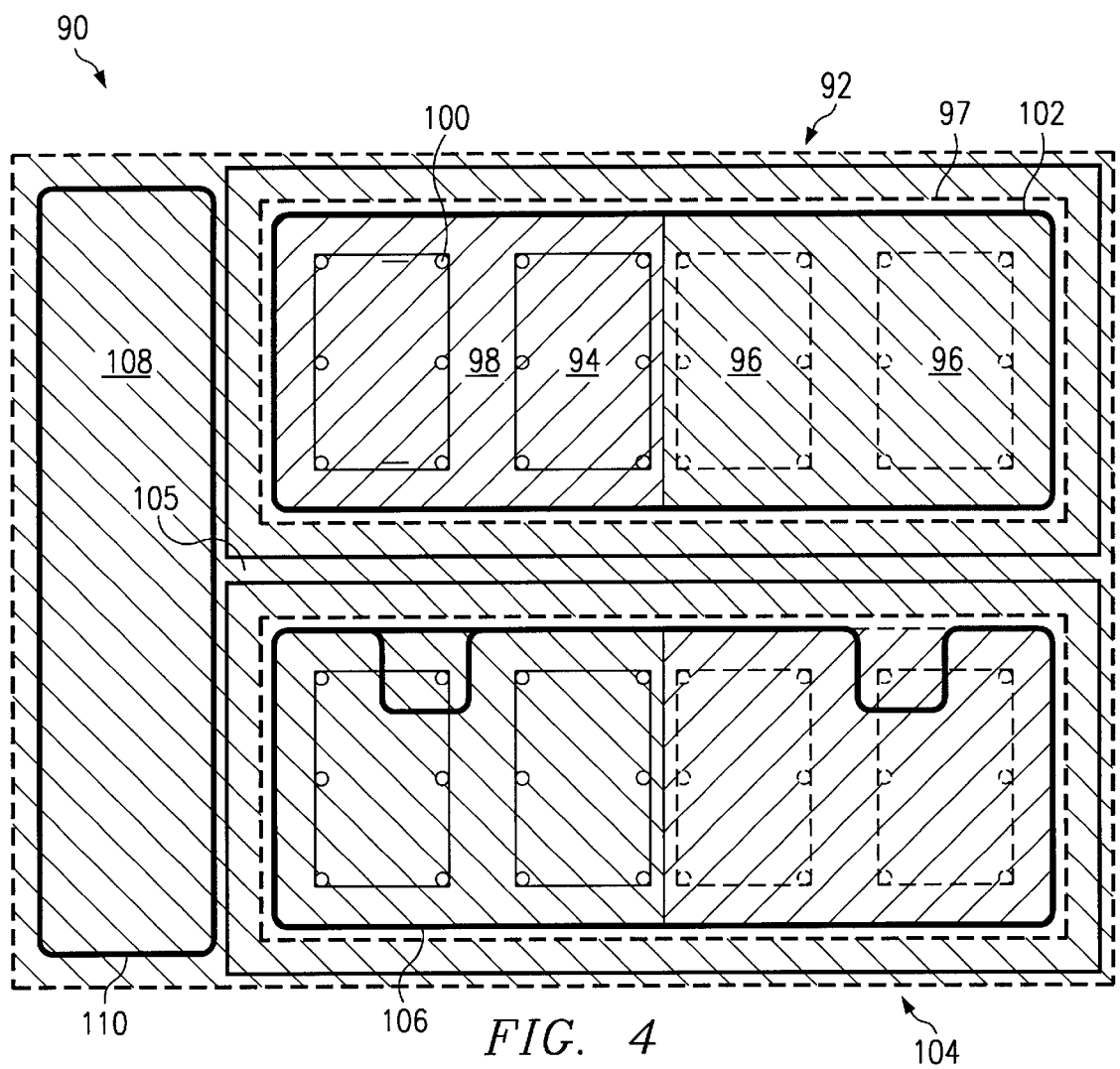
FIG. 4 illustrates a top view of a dual device constructed according to another embodiment.

FIG. 4 illustrates another embodiment of a semiconductor device 90 constructed according to the invention. A first overvoltage surge protection device 92 is formed with a pair of top buried regions 94 and a pair of bottom buried regions 96. The device can be constructed to provide a breakover voltage of, for example, 300 volts. A top emitter region 98 is formed over the top buried regions 94 in a top base region 97. The top emitter region 98 has formed therethrough a number of shorting dots, one identified as reference numeral 100. The bottom base region, the bottom emitter region with shorting dots are formed in a manner analogous to the corresponding regions 50, 58 and 60 of the device 40 of FIG. 2. In like manner, the bottom base and emitter regions and shorting dot arrangement (not shown) of device 92 is constructed in a similar manner and with the same process steps as the top device. A top metal contact 102 shown by the heavy line is formed in contact with the top surface of the emitter region 98 and the top surface of the top base region 97. While not shown, a bottom common contact is formed on the entire bottom surface of the chip 90. A bidirectional current-carrying device operating at a specified breakover voltage is thus achieved.

A second companion overvoltage protection device 104 is constructed in the device 90 and isolated by an isolation diffusion 105 that electrically separates the devices 92 and 104. The companion device 104 can be constructed to have a breakover voltage of, for example, 64 volts. Otherwise, the companion device 104 is constructed in the same manner as device 92. The device 104 has formed thereover a metal contact 106. The outline of the metal contact 104 is different from the other top contact 102 for the purpose of visually differentiating between the devices 92 and 104.

A conductive connector block 108 is formed from the bottom face of the chip 90 (in contact with the common bottom contact) to the top face of the chip 90. A top contact 110 provides an electrical connection, via the connector block 108, to the bottom contact (not shown). Accordingly, all contacts are made available to the top of the chip 90.

From the foregoing, disclosed is a method of fabricating a connector block through a semiconductor chip to provide a transfer of bottom side contacts to the top side of the chip, and vice versa. Those skilled in the art may prefer to embody the invention in different forms to realize the advantages thereof. For example, the connector block need not be capped on both sides with a metal contact. Rather, other diffusions can be utilized to provide a coupling of a circuit to the connector block. To that end, the invention is well adapted for those integrated circuits where power dissipation is not a concern. Where power dissipation is low, metallizations on the backside of the chip can be minimal, or entirely absent. Thus, an internal chip circuit interconnect to the connector block can be readily achieved. Also, while chips are disclosed having a pair of devices formed therein, the principles and concepts of the invention are applicable as well to chips incorporating fewer or more than two devices.

Thus, although the various embodiments have been described in detail, it should be understood that various changes, substitutions and alterations can be made therein without departing from the spirit and scope of the invention, as defined by the appended claims.

What is claimed is:

1. A semiconductor chip having opposing face surfaces, comprising:

a connector block formed through said semiconductor chip between said opposing face surfaces;

said connector block formed with a diffused dopant characterized by a diffusion constant of less than about $2 \times 10^{-11}$ cm$^2$/sec at about 1275° C., said dopant having an impurity concentration suitable for providing a low resistance conductor for circuit current;

a first circuit formed in one face surface of the semiconductor chip;

a first contact formed on said one face surface and electrically connected to said first circuit for carrying signal currents;

a second circuit formed in the opposing face surface of the semiconductor chip, said connector block electrically connected to said second circuit for carrying signal currents; and a second contact formed on said one face surface and electrically connected to said connector block, whereby said first and second contacts are formed on the same face surface of said semiconductor chip.

2. The semiconductor chip of claim 1, further including a third contact formed on said opposing face surface of said semiconductor chip in contact with said connector block.

3. The semiconductor chip of claim 2, wherein said second circuit is connected to said third contact, and wherein signal currents from said first circuit flow through a middle portion of said chip to said second circuit.

4. The semiconductor chip of claim 1, wherein said first and second circuits form a bidirectional current carrying device.

5. The semiconductor chip of claim 2, wherein said third contact is connected to said second circuit to carry current via said connector block to said second circuit.

6. The semiconductor chip of claim 1, wherein said connector block is formed in said semiconductor chip from both said face surfaces and overlaps within said chip.

7. The semiconductor chip of claim 1, wherein said connector block forms a PN junction with a semiconductor material in which said first and second circuits are formed.

8. A method of processing a semiconductor chip having opposing face surfaces, comprising the steps of:

forming a connector block in the semiconductor chip from one face surface thereof to an opposite face surface by depositing a slow diffusing impurity in the opposite face surface surfaces, said slow diffusing impurity characterized by a diffusion constant of less than about $2 \times 10^{-11}$ cm$^2$/sec at a temperature of about 1275° C.;

diffusing the impurity into the semiconductor chip until the impurity overlaps within said semiconductor chip;

forming a first circuit in said one face surface or said semiconductor chip, and forming a second circuit in said opposite face surface of said semiconductor chip;

forming a first metal contact on said one face surface electrically connected to said first circuit;

electrically connecting said second circuit to said connector block; and forming a second metal contact on said one face surface in electrical contact with said connector block, whereby said first and second metal contacts are formed on the same face surface of said semiconductor chip.

9. The method of claim 8, further including connecting said second circuit to said connector block for carrying signal currents with respect to said second circuit.

10. The method of claim 8, further including diffusing impurities to form a portion of said first and second circuits during diffusion of the slow diffusing impurities to form said connector block.

11. The method of claim 8, further including diffusing said impurity for a period of time exceeding two days.

12. The method of claim 10, further including diffusing said impurity for a period of time greater than about seven days.

13. The method of claim 8, further including diffusing said slow diffusing impurities selected from a group of semiconductor impurities including boron, gallium, phosphorus, arsenic and antimony.

14. A semiconductor chip, comprising:

an overvoltage protection device formed in said semiconductor chip, said overvoltage protection device including an upper buried region and a lower buried region to define a breakover voltage of said device, and said device being formed in one face surface and in an opposing face surface of said semiconductor chip to carry bidirectional currents;

a planar lead frame having a first planar member and a second planar member, a first contact formed on said one face surface of said semiconductor chip in electrical contact with said overvoltage protection device;

a connector block formed through said semiconductor chip from said one face surface to said opposing face surface of said semiconductor chip;

a second contact formed on said one face surface of said semiconductor chip in electrical contact with said connector block;

a third contact formed on said opposing face surface of said semiconductor chip in electrical contact with both said overvoltage protection device and said connector block; and said first planar member of said planar lead frame connected to said first contact and said second planar member connected to said second contact.

15. The semiconductor chip of claim 14, wherein said upper buried region defines a breakover voltage of one polarity, and said lower buried region defines a breakover voltage of an opposite polarity.

16. The semiconductor chip of claim 15, wherein said third contact is connected to said overvoltage protection device to carry signal currents to said connector block.

17. The semiconductor chip of claim 14, further including forming said connector block by using an impurity characterized by a diffusion constant of less than about $2 \times 10^{-11}$ cm$^2$/sec at a temperature of about 1275° C.

\* \* \* \* \*